United States Patent
Wang et al.

(10) Patent No.: US 7,886,260 B2
(45) Date of Patent: Feb. 8, 2011

(54) FOCUSED ION BEAM DEFINING PROCESS ENHANCEMENT

(75) Inventors: Hsin Wey Wang, Penang (MY); Ling How Goh, Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 922 days.

(21) Appl. No.: 11/809,055

(22) Filed: May 31, 2007

(65) Prior Publication Data

US 2008/0301615 A1    Dec. 4, 2008

(51) Int. Cl.
*G06F 17/50* (2006.01)
(52) U.S. Cl. ................................. 716/124; 716/125
(58) Field of Classification Search .............. 716/7–10, 716/118–125
See application file for complete search history.

(56) References Cited

U.S. PATENT DOCUMENTS 7,036,101 B2 *   4/2006   He et al. .................. 716/13

\* cited by examiner

*Primary Examiner*—Jack Chiang
*Assistant Examiner*—Binh C Tat
(74) *Attorney, Agent, or Firm*—Winkle, PLLC

(57) ABSTRACT

Embodiments employ a method to define points on selected nets in a netlist for a focused ion beam (FIB) to create open circuits. A selected net is partitioned into a set of sub-segments, and after considering all metal layers at and above that of the selected net, a subset of the set of sub-segments is formed as those sub-segments having minimum distances from the considered metal layers greater than some threshold. All contiguous sub-segments in the subset of the set of sub-segments are grouped into groups. The midpoints of such groups, and any isolated sub-segments, are possible candidate for FIB points. For some embodiments, the midpoint of the longest (or one of the longest) groups of sub-segments is chosen as the FIB point for the selected net. Other embodiments are described and claimed.

8 Claims, 1 Drawing Sheet

FOCUSED ION BEAM DEFINING PROCESS ENHANCEMENT

FIELD

The present invention relates to integrated circuit manufacturing, and more particularly, to a method for defining focused ion beam points in selected nets of the netlist for the integrated circuit.

BACKGROUND

Sometimes an engineering change of order (ECO) calls for the re-routing of signal paths in the design of an integrated circuit after masks have been made. Such re-routing often employs the use of a focused ion beam (FIB) to cause open circuits at selected FIB points at various metal interconnects in the integrated circuit. Usually, defining the FIB points is a manual process whereby a person uses a layout viewing tool to look through a massive network of metal layers in search of suitable FIB points. However, such a method is time consuming and tedious, and introduces the likelihood of human error, as well as delays.

DESCRIPTION OF EMBODIMENTS

Figure 1:
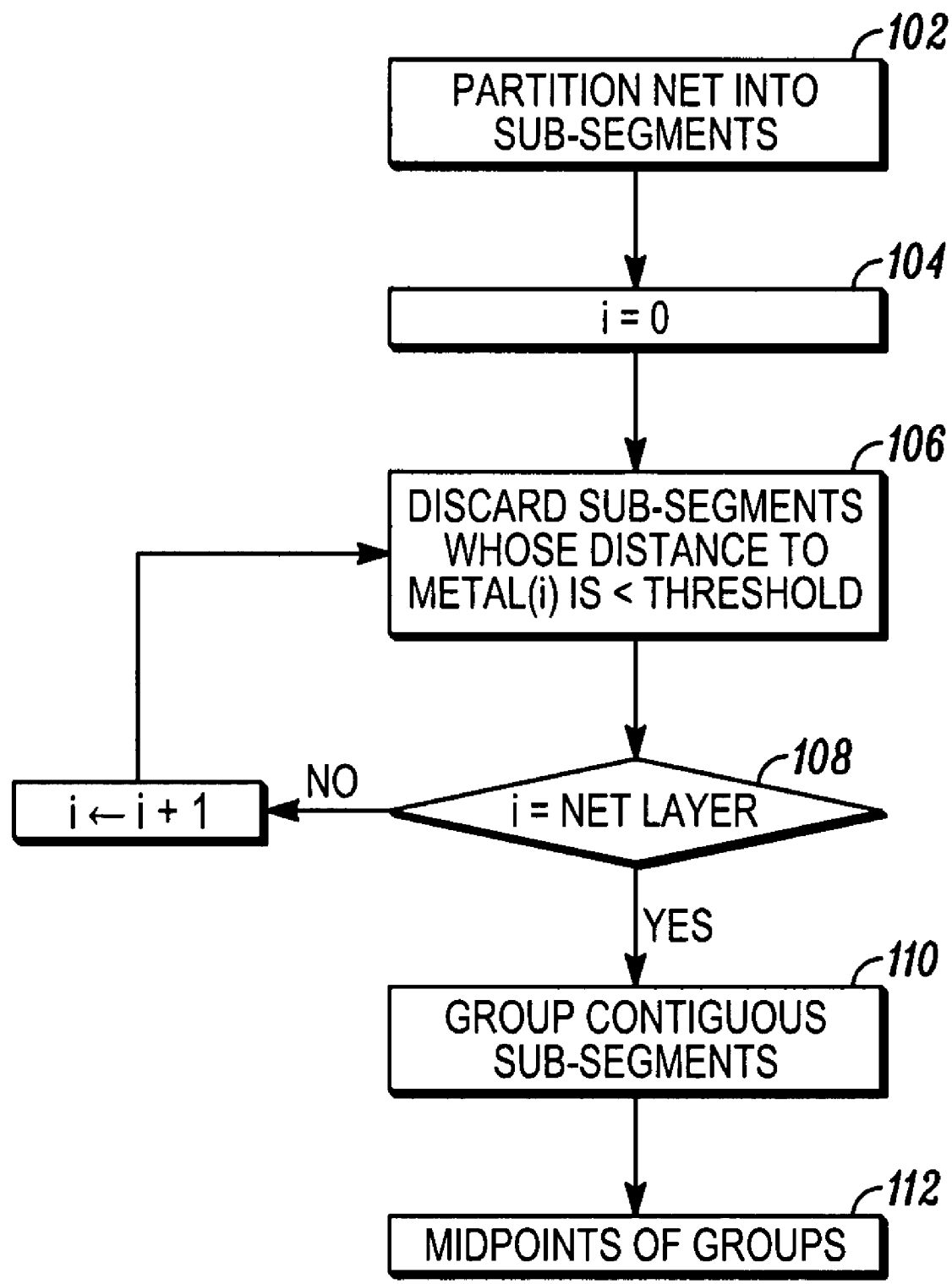
FIG. 1 illustrates a method according to an embodiment of the present invention.

In the description that follows, the scope of the term "some embodiments" is not to be so limited as to mean more than one embodiment, but rather, the scope may include one embodiment, more than one embodiment, or perhaps all embodiments.

A netlist usually conveys connectivity information of an integrated circuit by providing instances, nets, and perhaps some attributes. The nets represent the interconnects in an integrated circuit. One may view a net as an abstraction of its corresponding physical interconnect, but for ease of discussion the terms "net" and "interconnect" are used interchangeably. Embodiments provide an automated approach to defining suitable FIB points on a given net.

In a method according to an embodiment, a given net in which an FIB point is desired is partitioned into smaller sub-segments. A database comprising all the metal layers in the design is sorted according to metal layer type, as well as location. Starting with the top most metal layer, the database is used to find the minimum distance of each sub-segment in the given net to the top most metal layer. If the minimum distance from a sub-segment to the metal layer is less than some specified threshold, then the sub-segment is deemed unsuitable for an FIB point, and is discarded in any subsequent search for an FIB point. If the minimum distance is greater than the threshold, then the sub-segment is deemed as being a candidate for an FIB point, and so is not discarded. (The case in which the minimum distance is equal to the threshold may be handled in either way, that is, some embodiments may tag a sub-segment as unsuitable for an FIB point if its minimum distance to a metal layer is equal to the threshold, while other embodiments may tag the sub-segment as a candidate.) The result is a set of candidate sub-segments.

This process of discarding sub-segments is iterated for each metal layer until reaching the metal layer that the given net belongs to, where for each iteration of the method, the sub-segments considered are the candidates from the previous iteration. In this way, finer and finer subsets of the original set of sub-segments are created. When the iterations have reached the metal layer that the net belongs to, those sub-segments that are contiguous to one another are grouped into "larger" sub-segments. (There may be some cases in which there are isolated sub-segments with no contiguous neighbors, in which case such isolated sub-segments are not grouped into larger sub-segments.)

The result is a set of groups of sub-segments in a net, where each group is either an isolated sub-segment or a set of contiguous sub-segments, and where each sub-segment is not too close (e.g., at a minimum distance larger than the threshold) to all metal layers at or above the net. Candidate FIB points for the net may then be taken as the midpoints of each of the groups. All of these candidate FIB points may be chosen as FIB points, or some subset of them. For example, a single FIB point may be defined as a midpoint of the longest group of sub-segments, and if there is no single longest group, then some other criterion may be employed.

The above method may be outlined by the flow diagram of FIG. 1. In box 102, a net for which an FIB point is desired is selected from the netlist. Box 104 is merely introduced as a counting convenience, where the index i denotes a particular metal layer. Without loss of generality, i=0 denotes the top most metal layer, i=1 the next metal layer below the top most metal layer, and so on. In box 106, sub-segments are discarded if they are too close to the particular metal layer being compared. (The metal layers are also indexed by i for ease of description.) If in box 108 it is determined that the net layer hasn't yet been reached, then the index i is incremented by one so that the next lower metal layer may be considered in box 106. This process continues until in box 108 it is determined that the metal layer having the same layer index as the net has been reached, in which case control is brought to box 110 whereby contiguous sub-segments are grouped together. Box 112 defines the midpoints of the groups of contiguous sub-segments as possible FIB points, where some, or one, of such midpoints may define the actual FIB point.

The above described embodiment may be implemented on a programmable computer system.

Various modifications may be made to the described embodiments without departing from the scope of the invention as claimed below. For example, a point other than a midpoint of a group of contiguous sub-segments may be chosen as a possible FIB point. Furthermore, it should be understood that for those embodiments utilizing such midpoints, because all numerical computations are performed in finite precision and subject to round-off error, the midpoint is of course not necessarily the exact numerical midpoint.

What is claimed is:

1. A method comprising:
   providing a computer system, wherein the computer system implements the method of:
   partitioning a selected net from a netlist into a set of sub-segments;
   forming from the set of sub-segments a subset, where a sub-segment belongs to the subset if and only if its minimum distance to all metal layers at and above the selected net satisfies a relationship with a threshold; and
   grouping sub-segments belonging to the subset into groups of one or more sub-segments, so that the sub-segments in each group containing more than one sub-segment are contiguous.

2. The method as set forth in claim 1, further comprising: defining the midpoints of the groups of sub-segments as possible focused ion beam points.

3. The method as set forth in claim 2, further comprising:
defining the midpoint of a longest group in the groups of sub-segments as a focused ion beam point.

4. The method as set forth in claim 1, wherein the relationship is satisfied if the minimum distance is greater than or equal to a threshold.

5. An article of manufacture comprising a computer system to:
partition a selected net from a netlist into a set of sub-segments;
form from the set of sub-segments a subset, where a sub-segment belongs to the subset if and only if its minimum distance to all metal layers at and above the selected net satisfies a relationship with a threshold; and
group sub-segments belonging to the subset into groups of one or more sub-segments, so that the sub-segments in each group containing more than one sub-segment are contiguous.

6. The article of manufacture as set forth in claim 5, wherein the computer system may further:

define the midpoints of the groups of sub-segments as possible focused ion beam points.

7. The article of manufacture as set forth in claim 6, wherein the computer system may further:

define the midpoint of a longest group in the groups of sub-segments as a focused ion beam point.

8. The article of manufacture as set forth in claim 5, wherein the relationship is satisfied if the minimum distance is greater than or equal to a threshold.

* * * * *